(12) United States Patent
Kakuda et al.

(10) Patent No.: US 7,799,718 B2
(45) Date of Patent: Sep. 21, 2010

(54) DIELECTRIC CERAMIC COMPOSITION, COMPLEX ELECTRONIC DEVICE AND MULTILAYER CERAMIC CAPACITOR

(75) Inventors: Kouichi Kakuda, Narita (JP); Takashi Suzuki, Chiba (JP); Sachiko Takano, Ichikawa (JP); Hiroshi Momoi, Yuri Honjo (JP); Shinichi Kondo, Yurihonjo (JP); Masaki Takahashi, Nikaho (JP)

(73) Assignee: TDK Corporation, Tokyo (JP)

( * ) Notice: Subject to any disclaimer, the term of this patent is extended or adjusted under 35 U.S.C. 154(b) by 272 days.

(21) Appl. No.: 12/078,281

(22) Filed: Mar. 28, 2008

(65) Prior Publication Data

US 2008/0254968 A1    Oct. 16, 2008

(30) Foreign Application Priority Data

Mar. 30, 2007    (JP) ............................. 2007-095398

(51) Int. Cl.
*C04B 35/47*    (2006.01)
*H01G 4/12*    (2006.01)

(52) U.S. Cl. .................. 501/136; 361/321.4; 361/321.5

(58) Field of Classification Search ................. 501/137, 501/138, 136; 361/321.4, 321.5
See application file for complete search history.

(56) References Cited

U.S. PATENT DOCUMENTS

| | | | |
|---|---|---|---|
| 3,968,412 A | 7/1976 | Girard et al. | |
| 4,335,216 A | 6/1982 | Hodgkins et al. | |
| 4,898,844 A | 2/1990 | Maher et al. | |
| 5,036,425 A | 7/1991 | Omori et al. | |
| 6,008,981 A * | 12/1999 | Harada et al. | ............ 361/321.4 |
| 6,195,250 B1 * | 2/2001 | Matoba et al. | ............ 361/321.5 |
| 6,385,035 B1 * | 5/2002 | Matoba et al. | ............ 361/321.1 |
| 6,444,066 B1 | 9/2002 | Sugimoto | |
| 7,446,997 B2 * | 11/2008 | Kaneda et al. | ............ 361/321.1 |
| 2006/0087796 A1 | 4/2006 | Yamazaki et al. | |

FOREIGN PATENT DOCUMENTS

| | | | |
|---|---|---|---|
| DE | 4005505 | * | 8/1990 |
| EP | 0 817 215 A2 | | 1/1998 |
| EP | 0 843 410 A2 | | 5/1998 |
| EP | 1 710 817 A2 | | 10/2006 |
| EP | 1 724 244 A1 | | 11/2006 |
| GB | 2 247 014 A | | 2/1992 |
| JP | A-01-236514 | | 9/1989 |
| JP | 05006710 | * | 1/1993 |
| JP | A-05-006710 | | 1/1993 |

(Continued)

*Primary Examiner*—Karl E Group
(74) *Attorney, Agent, or Firm*—Oliff & Berridge, PLC (57) ABSTRACT

The present invention relates to a dielectric ceramic composition comprising a main component including at least one selected from barium titanate, strontium titanate and calcium titanate, and as a subcomponent, a glass component including an oxide of B, wherein a content of said glass component is 2 to 7 wt % with respect to 100 wt % of said main component. According to the present invention, there are provided a dielectric ceramic composition wherein a layer can be made thinner by relatively decreasing a content of the glass component, etc., as well as having good properties (specific permittivity, loss Q value and insulation resistance), and a complex electronic device such as a multilayer filter or a multilayer ceramic capacitor, which has a dielectric layer composed of the dielectric ceramic composition.

18 Claims, 7 Drawing Sheets

FOREIGN PATENT DOCUMENTS

| | | |
|---|---|---|
| JP | A-06-251995 | 9/1994 |
| JP | B2-3030557 | 4/2000 |
| JP | B2-3471839 | 12/2003 |
| JP | A-2005-183702 | 7/2005 |
| JP | A-2007-112689 | 5/2007 |
| JP | B2-4020886 | 12/2007 |
| WO | WO 2004/093109 A2 | 10/2004 |

\* cited by examiner

DIELECTRIC CERAMIC COMPOSITION, COMPLEX ELECTRONIC DEVICE AND MULTILAYER CERAMIC CAPACITOR

BACKGROUND OF THE INVENTION

1. Field of the Invention

The present invention relates to a dielectric ceramic composition sinterable at a low temperature, a complex electronic device and multilayer ceramic capacitor having the dielectric ceramic composition as a dielectric layer.

2. Description of the Related Art

With a demand for reduction in size and weight on an electronic hardware equipped with an electronic device, a demand for small multilayer electronic device is rapidly increased. Also, as a plurality of the electronic devices is placed on a circuit substrate, a multilayer filter as a type of complex electronic devices, wherein a coil and a capacitor is integrated, has been used against a high-frequency noise of the circuit substrate.

Since such a multilayer filter is an electronic device having a coil portion as well as a capacitor portion, in the production process, it is necessary to co-fire a magnetic material constituting the coil portion and a dielectric ceramic composition constituting the capacitor portion. In general, ferrite used as the magnetic material constituting the coil portion is low in sintering temperature, which is 800 to 900° C. Therefore, a material of the dielectric ceramic composition used in the capacitor portion of the multilayer filter is required to be sinterable at a low temperature.

For example, Japanese Patent No. 3030557 proposes a dielectric ceramic composition for low-temperature firing, which can be co-fired with an Ag-based internal electrode by adding a specific amount of glass to a main component comprising $SrTiO_3$ added with CuO, or MnO if needed.

On the other hand, with a recent trend to further downsize an electronic hardware, a demand for reduction in size and height of a multilayer filter are growing. To reduce the size and height of the multilayer filter while maintaining its performance, it is particularly necessary to reduce the size and thickness of a dielectric layer in a capacitor portion.

However, in Japanese Patent No. 3030557, the thickness of a dielectric layer comprised of a dielectric ceramic composition is 50 μm, and therefore, when making the layer thin, the reliability is not be secured. Also, since the dielectric ceramic composition disclosed in Japanese Patent No. 3030557 includes a relatively high content of a glass component, a grain size may be too large or a crystalline texture may be uneven, so that it is considered difficult to make a layer thin. Further, when the content of the glass component becomes too large, there is a problem that a plating solution goes into an inside of a body (a multilayer portion) when forming an external electrode as well as a tendency to reduce a specific permittivity. Also, too large amount of CuO results in segregation, causing a problem to reduce insulation resistance.

SUMMARY OF THE INVENTION

A purpose of the present invention, reflecting this situation, is to provide a dielectric ceramic composition, showing good properties (specific permittivity, loss Q value, insulation resistance) while a layer can be made thin by relatively decreasing contents of a glass component, etc., and a complex electronic device, such as a multilayer filter, or a multilayer ceramic capacitor, having a dielectric layer constituted by the dielectric ceramic composition.

To attain the above object, a dielectric ceramic composition according to the present invention comprises a main component including at least one selected from barium titanate, strontium titanate and calcium titanate, and as a subcomponent, a glass component including an oxide of B, wherein a content of said glass component is 2 to 7 wt % with respect to 100 wt % of said main component.

In the present invention, the glass component including the oxide of B is a low-melting glass having a glass softening point of 800° C. or lower. By including such a glass component in the above range, it is possible to sinter at a low temperature while relatively reducing the content of the glass component in the dielectric ceramic composition.

Preferably, said glass component does not include an oxide of Bi. Note that "not include an oxide of Bi" indicates that an oxide of Bi in an amount exceeding an impurity level is not included and that an amount of the impurity level (e.g. the content is 1000 ppm or less) may be included.

Preferably, said dielectric ceramic composition further comprises an oxide of Cu as a subcomponent; and a content of said oxide of Cu, calculated as a conversion of CuO, is more than 0 wt %, and 10 wt % or less with respect to 100 wt % of said main component.

Preferably, said dielectric ceramic composition further comprises an oxide of Mn as a subcomponent; and a content of said oxide of Mn, calculated as a conversion of MnO, is more than 0 wt %, and 1.5 wt % or less with respect to 100 wt % of said main component.

In addition to the above main component and the glass component as the subcomponent, by including an oxide of Cu and/or Mn in the above range, it is possible to sinter at a further lower temperature, and to improve properties (specific permittivity, loss Q value, insulation resistance, etc.)

Alternatively, it is preferable that each component constituting said glass component is included as a form of an oxide in the above dielectric ceramic composition instead of said glass component, and that a total content is 2 to 7 wt % which is equal to the content of the glass component.

It is possible to obtain the same effects as described above even when each component of the above glass component is included as a form of an oxide in the dielectric ceramic composition.

A complex electronic device according to the present invention comprises a coil portion constituted by a coiled conductor and a magnetic layer, and a capacitor portion constituted by an internal electrode layer and a dielectric layer, wherein said internal electrode layer includes Ag as a conducting material; and said dielectric layer is constituted by any one of the above described dielectric ceramic compositions.

As a complex electronic device according to the present invention, although not particularly limited, there are exemplified a multilayer filter, a multilayer noise filter, etc.

Alternatively, a multilayer ceramic capacitor according to the present invention comprises alternately stacked internal electrode layers and dielectric layers wherein said internal electrode layer includes Ag as a conducting material; and said dielectric layer is constituted by any one of the above described dielectric ceramic compositions.

According to the present invention, by relatively decreasing a content of a glass component including an oxide of B with respect to that of a main component including at least one selected from barium titanate, strontium titanate and calcium titanate, it is possible to obtain a highly reliable dielectric ceramic composition showing good properties (specific permittivity, loss Q value, insulation resistance, etc.) while controlling an increase in grain size and effectively preventing a plating solution from going into an inside of a body (a multilayer portion) when forming an external electrode. Also, since the glass component includes an oxide of B and glass softening point is 800° C. or lower, it is possible to fire at a low temperature (e.g. 950° C. or lower).

By applying such a dielectric ceramic composition in a dielectric layer, it is possible to effectively inhibit a problem to become difficult to make the layer thinner due to increase in grain size and reliability degradation due to penetration of the plating solution into the body, and to obtain a complex electronic device and multilayer ceramic capacitor having good properties. Also, as a conducting material of an internal electrode layer, Ag, which is low in DC resistance, is usable.

Also, in the present invention, by preferably including an oxide of Cu and/or an oxide of Mn in the above dielectric ceramic composition, it is possible to fire at a further lower temperature, and to obtain better properties. Therefore, as for a complex electronic device or a multilayer ceramic capacitor having a dielectric layer constituted by the dielectric ceramic composition, it is possible to improve the properties and to obtain high reliability.

Further, in the present invention, it is possible to obtain the same effects even when each component constituting the above glass component is included as a form of an oxide in the above dielectric ceramic composition not as a glass component.

BRIEF DESCRIPTION OF THE DRAWINGS

Hereinafter, the present invention will be described based on embodiments shown in drawings.

DESCRIPTION OF THE PREFERRED EMBODIMENTS

Multilayer Filter 1

Figure 1:
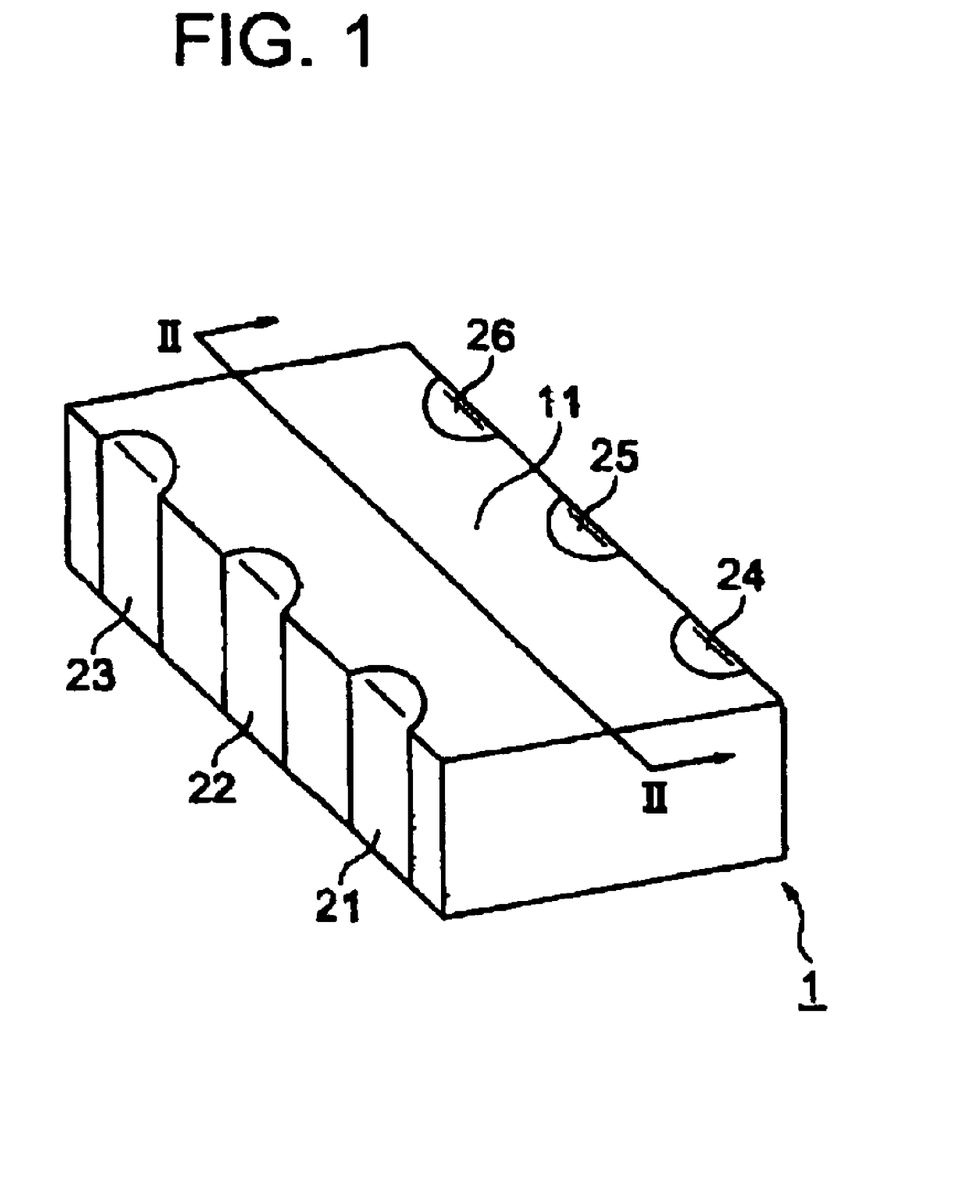
FIG. 1 is a perspective view of a multilayer filter according to an embodiment of the present invention.

As shown in FIG. 1, a multilayer filter 1 according to an embodiment of the present invention comprises a multilayer portion 11 as a main portion, external electrodes 21, 22 and 23 in the left side face in the figure and external electrodes 24, 25 and 26 in the right side face in the figure. The shape of the multilayer filter 1 is, although not particularly limited, normally a rectangular parallelepiped. Also, the size, which is not particularly limited and determined appropriately depending on the application, is normally (0.6 to 5.6 mm)×(0.3 to 5.0 mm)×(0.3 to 1.9 mm) or so. First, a structure of a multilayer filter according to the present embodiment will be described.

Figure 2:
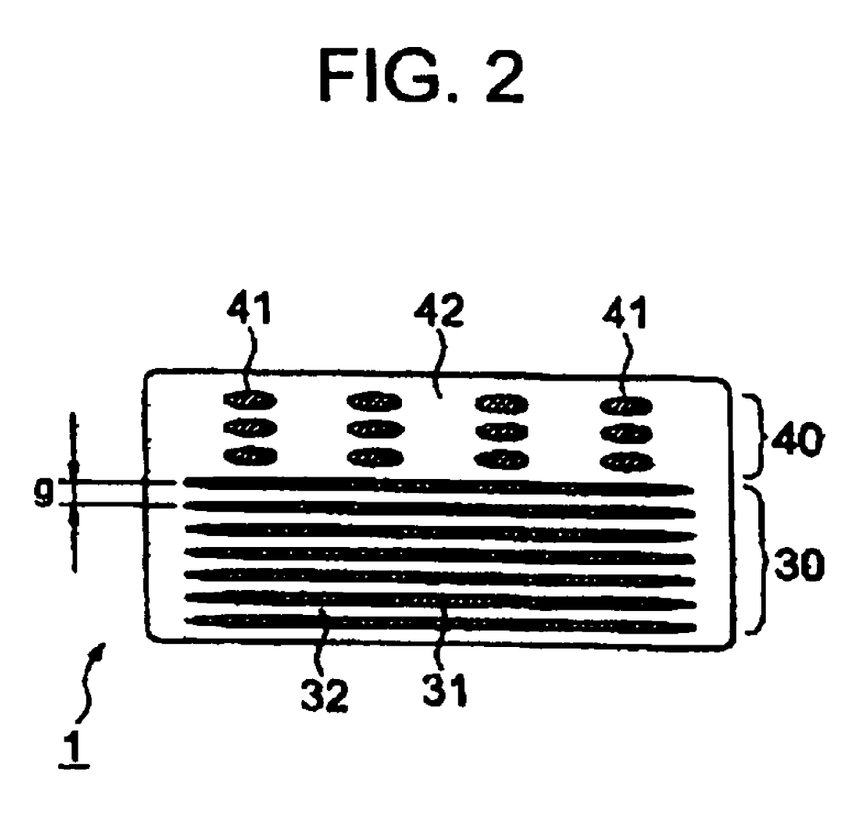
FIG. 2 is a sectional view of the multilayer filter along II-II line shown in FIG. 1.

FIG. 2 is a sectional view of the multilayer filter 1 along II-II line shown in FIG. 1. The multilayer filter 1 according to the present embodiment comprises a capacitor portion 30 in the lower layer portion and a coil portion 40 in the upper layer portion. The capacitor portion 30 is a multilayer capacitor wherein a plurality of dielectric layers 32 is formed between internal electrodes 31. On the other hand, in the coil portion 40, a coiled conductor 41 having a predetermined pattern is formed in a magnetic layer 42.

The dielectric layer 32 constituting the capacitor portion 30 includes a dielectric ceramic composition according to the present invention. The dielectric ceramic composition includes at least one selected from barium titanate, strontium titanate and calcium titanate as a main component, which is particularly preferably strontium titanate.

Barium titanate, strontium titanate and calcium titanate included as the main component has a perovskite-type structure, which can be expressed by a composition formula of $ABO_3$ (A=Ba, Sr and/or Ca; B=Ti) for example. A mole ratio of an element (Ba, Sr and/or Ca) positioned at the A site of the perovskite-type structure and Ti positioned at the B site is expressed by A/B by using A and B in the above composition formula. In the present embodiment, those with the ratio of $0.985 \leqq A/B \leqq 1.10$ can be used.

Also, the dielectric ceramic composition includes, in addition to the above main component, a glass component including an oxide of B and preferably not including an oxide of Bi as a subcomponent. The glass component is a low-melting glass having a glass softening point of 800° C. or lower. Note that the glass softening point is measured in accordance with JIS-R-3103.

Since the dielectric ceramic composition of the present embodiment comprises the low-melting glass component with a glass softening point of 800° C. or lower, it is possible to fire at a low temperature, for example, at 950° C. or lower, and to apply this to an electronic device wherein an internal electrode 31 is constituted by Ag having low DC resistance.

This glass component is not particularly limited as far as this is the one including an oxide of B and having a glass softening point of 800° C. or lower. Specifically, $B_2O_3$—ZnO—$SiO_2$-based glass, $B_2O_3$—$SiO_2$—BaO—CaO-based glass, $B_2O_3$—ZnO—BaO-based glass, $B_2O_3$—ZnO-based glass, $B_2O_3$—ZnO—$SiO_2$—BaO-based glass, etc., may be mentioned, and $B_2O_3$—ZnO-based glass and $B_2O_3$—ZnO—$SiO_2$-based glass are preferable as the glass component.

A content of the glass component is 2 to 7 wt %, preferably 2 to 5 wt %, with respect to 100 wt % of the main component. Note that the oxide component of B is preferably 15 wt % or more with respect to 100 wt % of the glass component.

When the content of the glass component is too low, there is a tendency not to obtain sufficient sinterability at a low temperature (e.g. 950° C. or lower). In contrast, when it is too large, specific permittivity tends to be reduced, resulting in difficulty in downsizing of an electronic device and reduction in reliability.

Also, in the present invention, instead of the above glass component, each component constituting the glass component may be included as a form of an oxide in the dielectric ceramic composition.

Namely, when the dielectric ceramic composition of the present embodiment does not include the above glass component, instead of the glass component, at least the oxide of B is included. Further, if needed, each component (ZnO, $SiO_2$, BaO, CaO, etc.) constituting the above-mentioned glass component is preferably included as a form of an oxide in the dielectric ceramic composition. It is particularly preferable to include an oxide of Zn and an oxide of Si. Even when including each component as an oxide instead of the above-mentioned glass component, same effects can be obtained. Note that it is preferred not to include an oxide of Bi even in this case.

In the above case, a total content as an oxide of each component constituting the glass component is, as with the content of the glass component, preferably 2 to 7 wt %, more preferably 2 to 5 wt %, with respect to 100 wt % of the main component. Also, in this case, a content of the oxide of B is preferably 0.3 to 1.8 wt % with respect to 100 wt % of the main component.

It is preferable that the dielectric ceramic composition of the present embodiment further includes an oxide of Cu. By including the oxide of Cu, it is possible to improve sinterability and to fire at a further lower temperature.

A content of the oxide of Cu is preferably more than 0 wt % and 10 wt % or lower, more preferably 0.1 to 3 wt %, with respect to 100 wt % of the main component. When the content of the oxide of Cu is too large, loss Q value and insulation resistance tend to be lowered, and the reliability tends to be reduced.

Also, it is preferable that the dielectric ceramic composition of the present embodiment further includes an oxide of Mn. By including the oxide of Mn, loss Q value and insulation resistance can be improved, resulting in increase in reliability as an electronic device.

A content of the oxide of Mn is preferably more than 0 wt % and 1.5 wt % or lower, more preferably 0.1 to 1 wt %, with respect to 100 wt % of the main component. When the content of the oxide of Mn is too large, specific permittivity and insulation resistance tend to be lowered, and the reliability tends to be reduced.

Also, by including each of the above components, the dielectric ceramic composition of the present embodiment can have a shrinkage factor closer to that of the later-mentioned magnetic layer 42 of the coil portion. As a result, it is possible to prevent structural defects such as peeling, warpage and crack generated between the dielectric layer 32 and the magnetic layer 42 at firing.

An average crystal grain size of a sintered dielectric crystal grain constituting the dielectric layer 32 is preferably 1.5 µm or less, more preferably 1.0 µm or less. The lower limit of the average crystal grain size is not particularly limited and normally 0.5 µm or so. When the average crystal grain size of the dielectric crystal grain is too large, insulation resistance tends to deteriorate.

The average crystal grain size of the dielectric crystal grain can be obtained by, for example, cutting the dielectric layer 32 to observe the cutting surface with SEM, measuring crystal grain sizes of the predetermined number of dielectric crystal grains, and calculating based on the measurement results. Note that a crystal grain size of each dielectric crystal grain can be obtained by, for example, a coding method wherein each crystal grain is assumed as a sphere. Also, at calculation of the average crystal grain size, the number of grains subject to measurement of the crystal grain size is normally 100 or more.

A thickness (g) of the dielectric layer 32 in a portion sandwiched by a pair of internal electrodes 31 is preferably 20 µm or less, more preferably 10 µm or less. By constituting the dielectric layer with the dielectric ceramic composition of the present invention, it is possible to have the thickness (g) of the dielectric layer 32 within the above range and to attain a thinner layer.

A conducting material included in the internal electrode 31 constituting the capacitor portion 30 is not particularly limited. Since the dielectric ceramic composition of the present invention can be fired at a low temperature (e.g. 950° C. or lower), in the present embodiment, Ag with low DC resistance is used as a conducting material.

A thickness of the internal electrode 31 is not particularly limited, and properly determined depending on the thickness of the dielectric layer 32. A ratio to the thickness of the dielectric layer is preferably 35% or less, more preferably 30% or less. By making the thickness of the internal electrode 31 35% or less, further preferably 30% or less, of that of the dielectric layer 32 in this way, it is possible to effectively prevent an interlayer peeling phenomenon called delamination. Particularly, by making it 30% or less, an incidence of delamination can be approximately 0%.

The magnetic layer 42 constituting the coil portion 40 comprises a magnetic material. As a magnetic material, although not particularly limited, a ferrite including an oxide of Ni, an oxide of Cu, an oxide of Zn or an oxide of Mn, etc. as a main component is preferable. As the ferrite, for example, there are mentioned Ni—Cu—Zn-based ferrite, Cu—Zn-based ferrite, Ni—Cu-based ferrite, Ni—Cu—Zn—Mg-based ferrite, etc. Among these, Ni—Cu—Zn-based ferrite or Cu—Zn-based ferrite is preferred to be used. Note that the magnetic layer 42 may include, in addition to the above main component, a subcomponent if needed.

As a conducting material included in the coiled conductor 41 constituting the coil portion 40, a same material can be used as that of the internal electrode 31.

As external electrodes 21 to 26, although not particularly limited, an Ag electrode can be used, and is preferably plated with Cu—Ni—Sn, Ni—Sn, Ni—Au, Ni—Ag, etc.

Production Method of Multilayer Filter 1

The multilayer filter of the present embodiment is produced by, as with conventional multilayer filters, preparing a dielectric green sheet and a magnetic green sheet, stacking these green sheets, forming a green-state multilayer portion 11, and forming external electrodes 21 to 26 after firing. Hereinafter, the production method will be specifically described.

Production of Dielectric Green Sheet

First, each main component material constituting a dielectric ceramic composition material and other subcomponent materials if needed are prepared.

As a main component material, barium titanate, strontium titanate and calcium titanate, mixture thereof and composite oxide can be used. It is also possible to properly select from a variety of compounds to become the above oxide or composite oxide by firing, for example, carbonate, oxalate, nitrate, hydroxide, organic metallic compound, etc., and to mix for use.

As a material of the glass component, which is the subcomponent, an oxide constituting the glass component, mixture thereof and composite oxide, in addition to a variety of compounds to become the oxide or composite oxide constituting the glass component by firing, can be used.

The glass component can be obtained by mixing materials including oxide, etc., which constitutes the glass component, firing followed by rapid cooling, and vitrifying.

Note that instead of the glass component, an oxide, etc., constituting the above glass component can be used as a subcomponent material.

Subcomponents other than the glass component may be prepared accordingly depending on the kind of the additional subcomponent. For example, it is preferred to use an oxide of Cu or Mn, or a compound to become the oxide of Cu or Mn by firing.

Next, each of the main component material and subcomponent material are mixed to prepare a mixture of powder. As a method of mixing each of the main component material and subcomponent material, although not particularly limited, for example, there may be mentioned a method of dry-mixing material powders in a powdery state, or of wet-mixing material powders, to which water, organic solvent, etc. is added, by using a ball mill, etc.

Then, the above obtained mixture of powder is subject to calcine to prepare a powder wherein a reaction with the subcomponent is promoted. The calcine is performed at a holding temperature of preferably 500 to 850° C., further preferably 600 to 850° C., for a temperature holding time of preferably 1 to 15 hours. The calcine may be performed in air, in an atmosphere having higher oxygen partial pressure than that in the air, or pure oxygen atmosphere.

Next, the powder obtained by calcine is pulverized to prepare a pre-fired powder. As a method of pulverizing the calcined powder, although not particularly limited, for example, there may be mentioned a method to add water, organic solvent, etc., to the calcined powder and then to wet-mix them by using a ball mill, etc. Then, the obtained pre-fired powder is made a paste, so that a dielectric layer paste is prepared.

The dielectric layer paste may be either an organic paste wherein the pre-fired powder and organic vehicle are kneaded, or water-based paste.

An internal electrode paste is obtained by kneading Ag as a conducting material and the above organic vehicle.

A content of the organic vehicle in each of the above paste is not particularly limited and may be a normal content, for example, about 5 to 15 wt % of a binder and about 50 to 150 wt % of a solvent with respect to 100 wt % of the powder before firing. Also, each paste may include an additive selected from a variety of dispersants, plasticizers, etc., if needed. The total content is preferably 10 wt % or less.

Next, the dielectric layer paste is made a sheet by a doctor blade method, etc., to form a dielectric green sheet.

Next, on the dielectric green sheet, an internal electrode is formed. The internal electrode is formed by applying the internal electrode paste by a method such as a screen printing, etc., on the dielectric green sheet. Note that a forming pattern of the internal electrode is properly selected depending on a circuit configuration, etc., of a multilayer filter to be produced, and that in the present embodiment, it is each pattern as described below.

Production of Magnetic Green Sheet

First, a magnetic material to be included in a magnetic layer paste is prepared to make a paste, so that the magnetic layer paste is obtained.

The magnetic layer paste may be an organic paste obtained by kneading the magnetic material and an organic vehicle, or water-based paste.

As a magnetic material, as a starting material of the main component, it is possible to properly select from each oxide of Fe, Ni, Cu, Zn and Mg or a variety of compounds to become the respective oxides after firing, for example, carbonate, oxalate, nitrate, hydroxide and organic metallic compound, and to mix for use. Also, the magnetic material may include, in addition to the above main component, a starting material of the subcomponent if needed.

Note that before making the magnetic layer paste from the magnetic material, each starting material constituting the magnetic material may be preliminarily reacted by calcine synthesis, etc.

A coiled conductor paste is obtained by kneading a conducting material such as Ag and the above organic vehicle.

Next, the magnetic layer paste is made a sheet by a doctor blade method, etc., to form a magnetic green sheet.

Next, on the above obtained magnetic green sheet, a coiled conductor is formed. The coiled conductor is formed by applying the coiled conductor paste by a method such as a screen printing on the magnetic green sheet. Note that a forming pattern of the coiled conductor is properly selected depending on a circuit configuration, etc., of a multilayer filter to be produced, and that in the present embodiment, it is each pattern as described below.

Next, in the coiled conductor on the magnetic green sheet, a throughhole is formed. A forming of the throughhole is not particularly limited in a method, and it is performed by, for example, laser processing, etc. Note that a position where the throughhole is formed is not particularly limited as far as it is on the coiled conductor, but that a preferable position is an end portion of the coiled conductor. In the present embodiment, it is formed at each position as described below.

Stacking of Green Sheets

Next, each of the above obtained dielectric green sheet and magnetic green sheet is alternately stacked to form a green-state multilayer portion 11.

Figure 3:
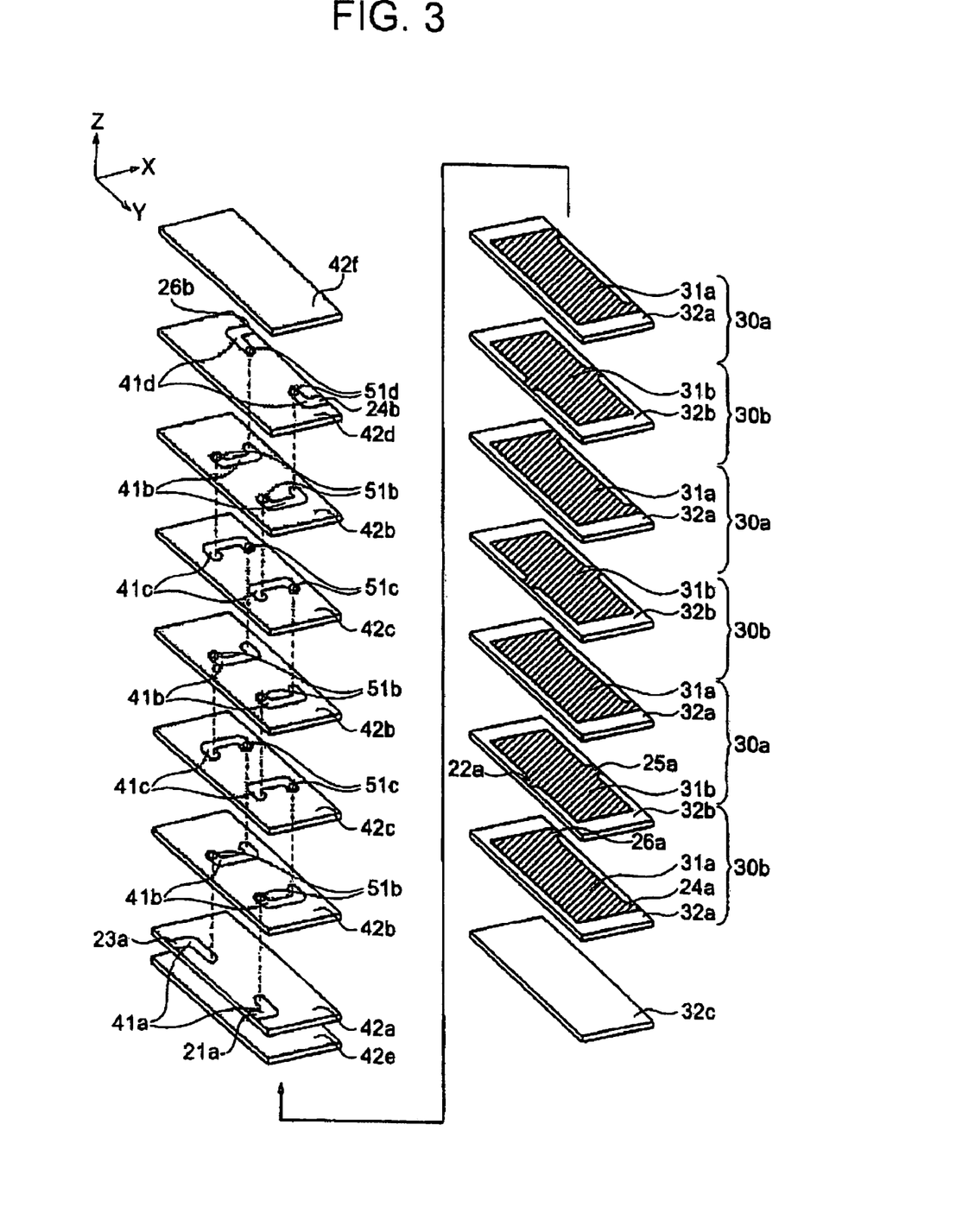
FIG. 3 is an exploded perspective view showing a laminate structure of a multilayer filter according to an embodiment of the present invention.

In the present embodiment, the green-state multilayer portion 11 is, as shown in FIG. 3, produced by stacking a plurality of dielectric green sheets wherein the internal electrode constituting the capacitor portion is formed, and on it, stacking a plurality of the magnetic green sheets wherein the coiled conductor constituting the coil portion is formed.

Below, a stacking process of the green sheets will be described in detail.

First, in the lowest layer, a dielectric green sheet 32*c* wherein the internal electrode is not formed is placed. The dielectric green sheet 32*c* wherein the internal electrode is not formed is used for protecting the capacitor portion, and the thickness may be properly adjusted.

Next, on the dielectric green sheet 32*c* wherein the internal electrode is not formed, a dielectric green sheet 32*a* wherein the internal electrode 31*a* having a pair of derivation portions 24*a* and 26*a* is formed is stacked. The derivation portions 24*a* and 26*a* are projected in an end portion of the dielectric green sheet from a lateral portion of a back side of lateral direction X of the dielectric green sheet.

Next, on the dielectric green sheet 32*a* wherein the internal electrode 31*a* is formed, a dielectric green sheet 32*b* wherein the internal electrode 31*b* having a pair of derivation portions 22*a* and 25*a* is formed is stacked. The derivation portions 22*a* and 25*a* are respectively projected in an end portion of the dielectric green sheet from both a front side and a back side of lateral direction X of the dielectric green sheet.

Then, by stacking the dielectric green sheet 32*a* wherein the internal electrode 31*a* is thus formed and the dielectric green sheet 32*b* wherein the internal electrode 31*b* is formed, a green-state single-layer capacitor 30*b* is formed, which is composed of the internal electrodes 31*a* and 31*b*, and the dielectric green sheet 32*b*.

Next, on the dielectric green sheet 32*b* wherein the internal electrode 31*b* is formed, the dielectric green sheet 32*a* wherein the internal electrode 31*a* is formed is stacked, and a green-state single-layer capacitor 30*a* is similarly formed, which is composed of the internal electrodes 31*a* and 31*b*, and the dielectric green sheet 32*a*.

Similarly, by alternately stacking the dielectric green sheet 32*a* wherein the internal electrode 31*a* is formed and the dielectric green sheet 32*b* wherein the internal electrode 31*b* is formed, it is possible to obtain a capacitor portion wherein a plurality of green-state single-layer capacitors 30a and 30b is alternately formed. Note that the present embodiment exemplifies a mode wherein a total of 6 layers of the single-layer capacitors 30a and 30b are stacked, but the number of stacked layers is not particularly limited and may be properly selected in accordance with the purpose.

Next, on the above-obtained green-state capacitor portion, a green-state coil portion is formed.

First, on the capacitor portion, a magnetic green sheet 42e wherein the coiled conductor is not formed is stacked. The magnetic green sheet 42e wherein the coiled conductor to be stacked on the capacitor portion is not formed is used for a purpose to separate the capacitor portion and the coil portion, and the thickness may be properly adjusted. Note that the present embodiment exemplifies a mode wherein the magnetic green sheet 42e is used for separating the capacitor portion and the coil portion, but instead of the magnetic green sheet 42e, the dielectric green sheet can be used.

Next, on the magnetic green sheet 42e wherein the coiled conductor is not formed, a magnetic green sheet 42a wherein a pair of coiled conductors 41a respectively having derivation portions 21a and 23a is formed is stacked. One end of the derivation portions 21a and 23a is projected in an end portion of a front side of lateral direction X of the magnetic green sheet.

Then, a magnetic green sheet 42b wherein a pair of approximately C-shaped coiled conductors 41b is formed is stacked thereon. Note that the approximately C-shaped coiled conductor 41b is arranged so as to have its curved portion in a front side of longitudinal direction Y of the magnetic green sheet, and further that a throughhole 51b is formed in one end of a front side of lateral direction X of the magnetic green sheet.

Also, when stacking the magnetic green sheet 42b wherein a pair of approximately C-shaped coiled conductors 41b is formed, by using a conductive paste, via a pair of throughholes 51b formed on the magnetic green sheet 42b, the coiled conductor 41a and the coiled conductor 41b are electrically jointed. Note that the conductive paste used for connecting the throughholes is not particularly limited but that Ag paste is preferably used.

Then, on the magnetic green sheet 42b, a magnetic green sheet 42c wherein a pair of coiled conductor 41c is formed in a backward pattern of that of the coiled conductor 41b is stacked. Namely, in the magnetic green sheet 42c, the coiled conductor 41c is arranged so as to have its curved portion in a back side of longitudinal direction Y of the magnetic green sheet 42c, and on this coiled conductor 41c, a pair of throughholes 51c is formed in one end of a back side of lateral direction X of the magnetic green sheet. Similarly, by using a conductive paste, via the throughhole 51c, the coiled conductor 41b and the coiled conductor 41c are electrically jointed.

Similarly, a plurality of magnetic green sheets 42b wherein the coiled conductor 41b is formed and magnetic green sheets 42c wherein the coiled conductor 41c is formed is alternately stacked. Next, on the magnetic green sheet 42b wherein the coiled conductor 41b is formed, a magnetic green sheet 42d is stacked. The magnetic green sheet 42d is a magnetic green sheet wherein a pair of coiled conductors 41d respectively having derivation portions 24b and 26b, one end of which is projected in an end portion of a back side of lateral direction X of the magnetic green sheet 42d, is formed. Note that when stacking the magnetic green sheet 42d, via a pair of throughholes 51d formed in one end of a front side of lateral direction X on the coiled conductor 41d, by using a conductive paste, the coiled conductor 41b and the coiled conductor 41d are electrically jointed.

Finally, on the magnetic green sheet 42d wherein the coiled conductor 41d is formed, a magnetic green sheet 42f wherein the coiled conductor is not formed is stacked. The magnetic green sheet 42f is used for protecting the coil portion and adjusting a thickness of the multilayer filter, and the thickness may be properly adjusted so as to have a desired thickness of the multilayer filter.

As described above, by jointing the coiled conductor on each magnetic green sheet via each throughhole, a coil wherein two magnetic green sheets make one roll is formed.

Firing of Multilayer Portion and Formation of External Electrode

Next, the green-state multilayer portion obtained by alternately stacking the dielectric green sheet and the magnetic green sheet is fired. Firing conditions include a temperature rising rate of preferably 50 to 500° C./hour and further preferably 200 to 300° C./hour, a holding temperature of preferably 840 to 900° C., a temperature holding time of preferably 0.5 to 8 hours and further preferably 1 to 3 hours, and a cooling rate of preferably 50 to 500° C./hour and further preferably 200 to 300° C./hour.

Next, the fired multilayer portion is subject to end surface polishing by, for example, barrel-polishing or sand blasting, etc. External electrodes 21 to 26 shown in FIG. 1 are formed by baking after applying an external electrode paste to both side surfaces of the multilayer portion followed by drying. The external electrode paste can be prepared by kneading a conducting material such as Ag and the above organic vehicle. Note that on thus-formed external electrodes 21 to 26, it is preferable to electroplate with Cu—Ni—Sn, Ni—Sn, Ni—Au, Ni—Ag, etc.

When forming the external electrode, the external electrodes 21 and 23 become input-output terminals by connecting to derivation portions 21a and 23a of the coil portion shown in FIG. 3. Also, the external electrode 24 becomes an input-output terminal to connect the capacitor portion and the coil portion by connecting to each derivation portion 24a of the capacitor portion and derivation portion 24b of the coil portion. Similarly, the external electrode 26 becomes an input-output terminal to connect the capacitor portion and the coil portion by connecting to each derivation portion 26a of the capacitor portion and derivation portion 26b of the coil portion. The external electrodes 22 and 25 become earth terminals by respectively connecting to each derivation portion 22a and 25a of the capacitor portion.

Figure 4:
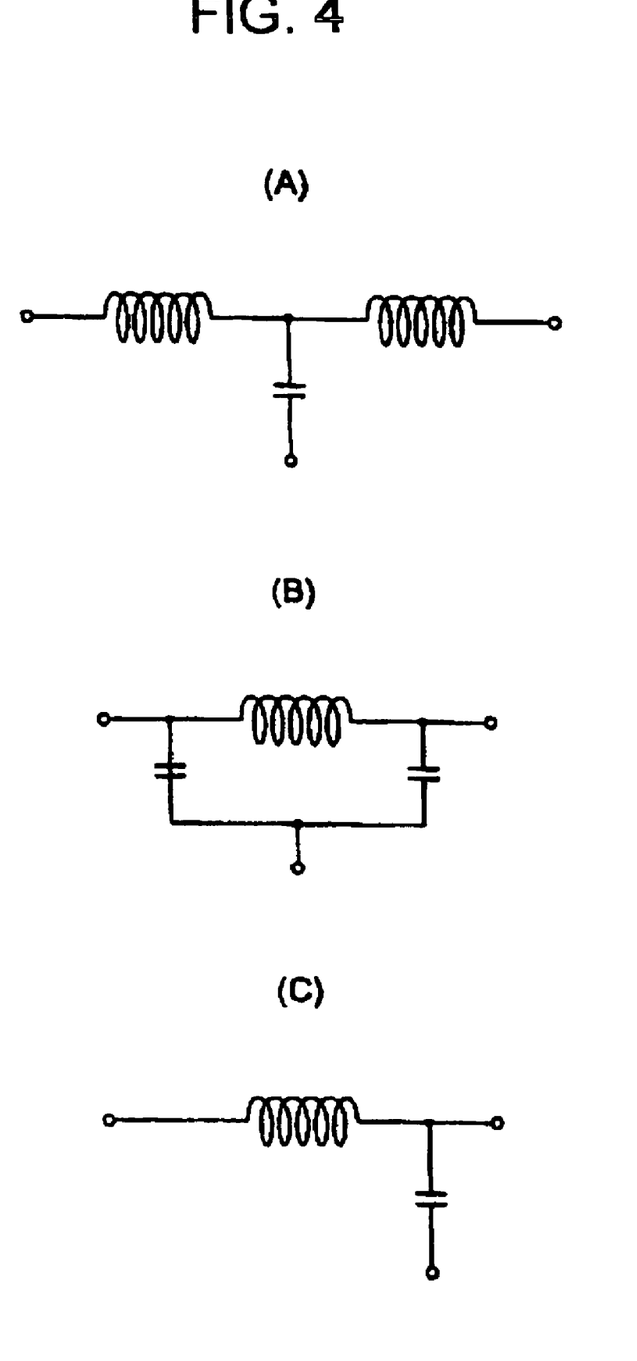
FIG. 4A is a circuit diagram of a T-shaped circuit.
FIG. 4B is a circuit diagram of a n-shaped circuit.
FIG. 4C is a circuit diagram of a L-shaped circuit.

As described above, by forming each of the external electrodes 21 to 26 in the multilayer portion 11, the multilayer filter of the present embodiment is resulted in configuring a T-shaped circuit shown in FIG. 4A.

Thus produced multilayer filter of the present embodiment is mounted on a printed-circuit board, etc., by soldering, etc. to use in a variety of electronic hardware, etc.

Hereinbefore, embodiments of the present invention are described, but the present invention is not limited to the above-mentioned embodiments and can be variously modified within the scope of the present invention.

For example, the above mentioned embodiment exemplifies the multilayer filter wherein the T-shaped circuit is formed, but it can be a multilayer filter wherein another lumped-constant circuit is formed. As an example of another lumped-constant circuit, there may be mentioned n-shaped circuit shown in FIG. 4B, L-shaped circuit shown in FIG. 4C, and double-n-shaped circuit formed by two n-shaped circuits. Also, a multilayer filter of the present invention can be a multilayer filter 101 wherein four L-shaped circuits are formed as shown in FIG. 5 and FIG. 6.

Figure 5:
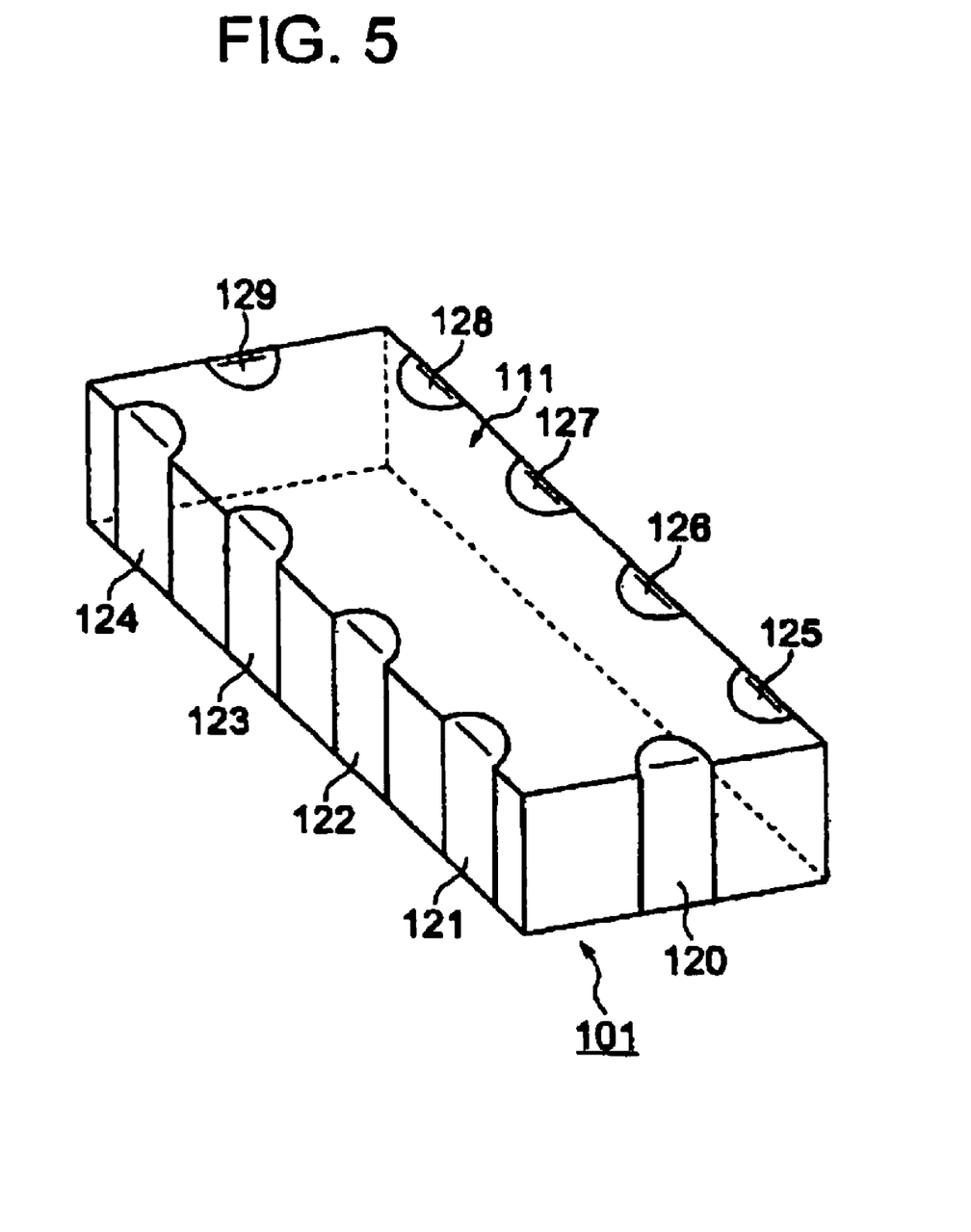
FIG. 5 is a perspective view of a multilayer filter according to another embodiment of the present invention.
Figure 6:
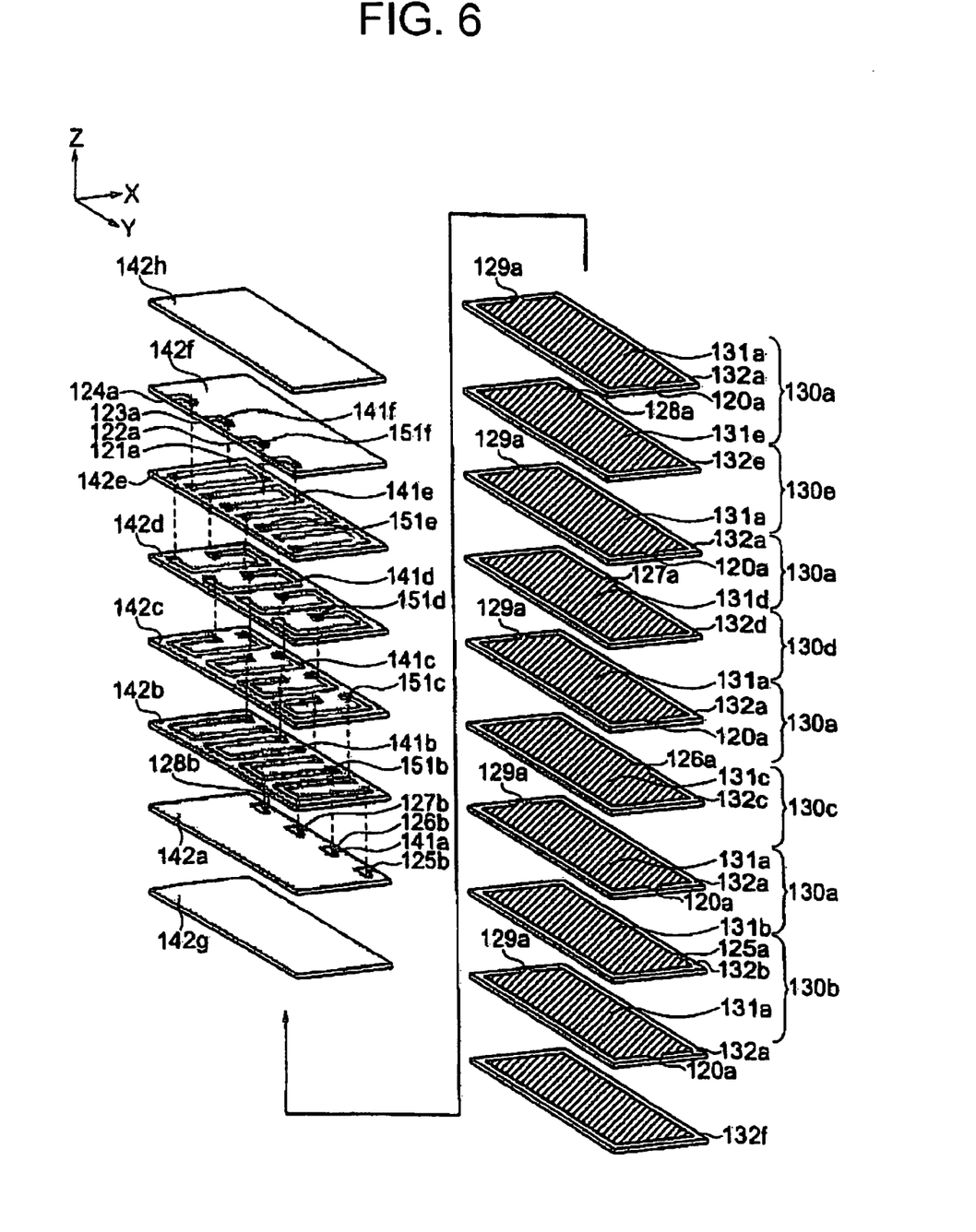
FIG. 6 is an exploded perspective view showing a laminate structure of a multilayer filter according to another embodiment of the present invention.

In the multilayer filter 101 wherein four L-shaped circuits are formed as shown in FIG. 5 and FIG. 6, it is possible to use same materials constituting the dielectric layer and the magnetic layer as those in the above mentioned embodiment, and to produce the dielectric green sheet and the magnetic green sheet as with the above mentioned embodiment.

In the multilayer filter shown in FIG. 5 and FIG. 6, external electrodes 121 to 124 shown in FIG. 5 are connected to each of derivation portions 121a to 124a of the coil portion shown in FIG. 6 to form input-output terminals. Also similarly, external electrodes 125 to 128 are connected to each of derivation portions 125a to 128a of the capacitor portion and each of derivation portions 125b to 128b of the coil portion to form input-output terminals for connecting the capacitor portion and the coil portion. Further, external electrodes 120 and 129 are respectively connected to each of derivation portions 120a and 129a of the capacitor portion to form earth terminals.

In this way, the multilayer filter 101 shown in FIG. 5 and FIG. 6 has a configuration that four L-shaped circuits are formed as shown in FIG. 4C.

Also, the above mentioned embodiment exemplifies a multilayer filter as a complex electronic device according to the present invention, but a complex electronic device according to the present invention is not limited to a multilayer filter, and may be any as far as it has a dielectric layer composed of the above dielectric ceramic composition.

Figure 7:
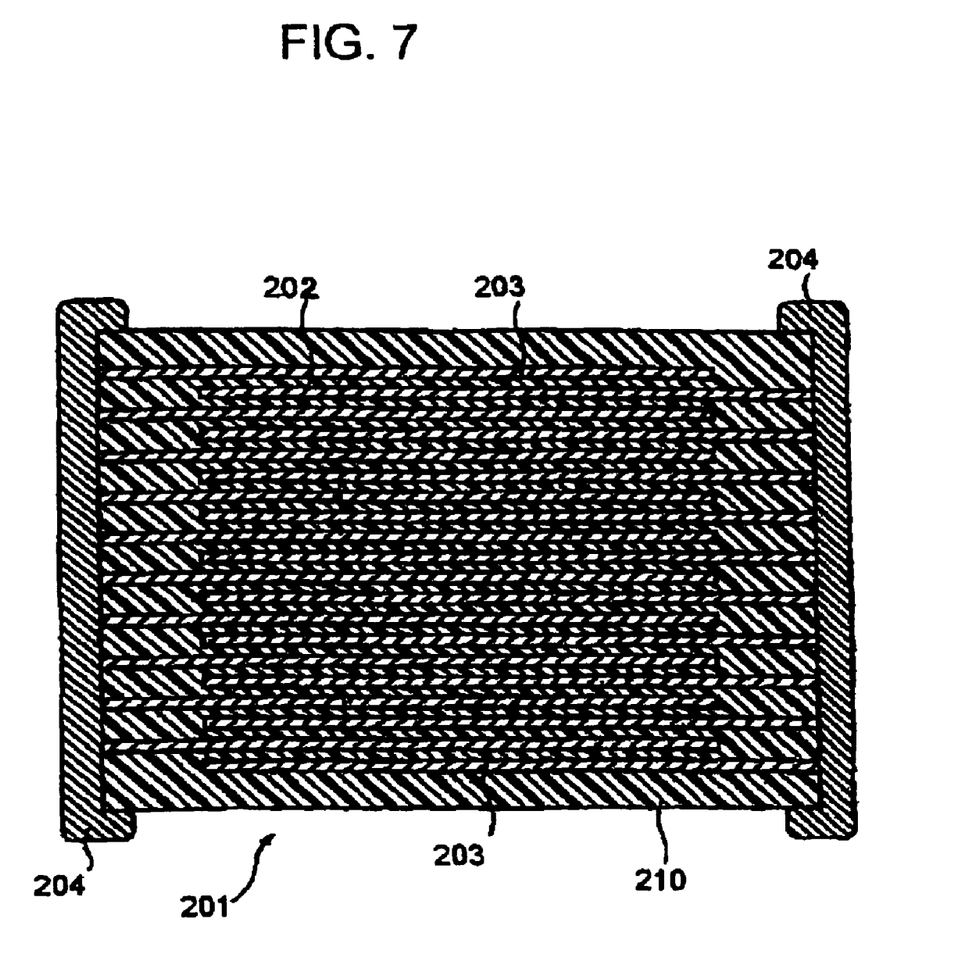
FIG. 7 is a sectional view of a multilayer ceramic capacitor according to another embodiment of the present invention.

Further, as shown in FIG. 7, another example may be a multilayer ceramic capacitor 201 comprising an element body 210, in which dielectric layers 202 and internal electrode layers 203 are alternately stacked, and the both end portions of which external electrodes 204 are formed. In this case, it is preferred to use Ag as a conductive material in the internal electrode layer.

EXAMPLES

Hereinafter, the present invention will be described based on the further detailed examples, but the present invention is not limited to the examples.

Example 1

First, $SrTiO_3$ as a main component material constituting a dielectric ceramic composition material and $B_2O_3$—$ZnO$—$SiO_2$-based glass, CuO and $MnCO_3$ as a subcomponent material were prepared. Note that A/B ratio of $SrTiO_3$, i.e. Sr/Ti ratio, was 1.00, and that a glass softening point of the $B_2O_3$—$ZnO$—$SiO_2$-based glass was 630° C. Also, $MnCO_3$ was to be included in a form of MnO in a dielectric ceramic composition after firing.

Also, as the $B_2O_3$—$ZnO$—$SiO_2$-based glass, a commercial glass was used.

Note that a composition of the $B_2O_3$—$ZnO$—$SiO_2$-based glass was $B_2O_3$: 20 wt %, ZnO: 65 wt %, and $SiO_2$: 15 wt %.

These materials were weighed and compounded so as to have a composition ratio shown in Table 1 after firing, and wet mixed by a ball mill for 16 hours. After wet mixing, the obtained slurry was dried by a dryer under a condition of 150° C.-24 h, followed by calcine at 800° C. of the dried mixture of powders in a batch furnace to obtain a calcined powder. The calcined powder was wet mixed by a ball mill, and the obtained slurry was dried by a dryer under a condition of 150° C.-24 h to obtain a dielectric ceramic composition material.

Next, to the dielectric ceramic composition material, an acrylic resin diluted by a solvent was added as an organic binder, and after granulating, it was subject to pressure forming to obtain a discoid pressed article with a diameter of 12 mm and a thickness of 3 mm. The pressed article was fired in air under a condition of 900° C.-2 h to obtain a sintered body.

As for the obtained sintered body, a shrinkage factor was calculated based on dimensions of the pressed article before firing and of the sintered body after firing. The results are shown in Table 1. Also, a density of the sintered body was calculated based on dimensions and weight of the sintered body after firing to calculate a relative density as the density of the sintered body with respect to theoretical density. The relative density of 90% or more was evaluated as GOOD. The results are shown in Table 1.

Further, the both faces of the obtained sintered body was subject to In—Ga coating to form electrodes, and then, specific permittivity and loss Q value and insulation resistance were evaluated.

Specific Permittivity

As for the sintered body wherein electrodes were formed, capacitance 'C' at reference temperature of 20° C. was measured with digital LCR meter (4274A by YHP) under the conditions of frequency at 1 MHz and input signal level (measured voltage) at 1 Vrms/μm. Then, a specific permittivity (no unit) was calculated based on the obtained capacitance, and an electrode area and a distance between electrodes of the sintered body. As an evaluation criterion, those of 200 or more were evaluated as GOOD. The results are shown in Table 1.

Loss Q Value

Dielectric loss (tan δ) was measured under the same measurement conditions as the specific permittivity to calculate loss Q value (=1/tan δ) based on the obtained dielectric loss (tan δ). The higher loss Q value is preferable. As an evaluation criterion, those of 200 or more were evaluated as GOOD. The results are shown in Table 1.

Insulation Resistance (ρ)

As for the sintered body wherein electrodes were formed, a resistance value was measured after applying 25V of DC at 25° C. for 30 seconds by using an insulation resistance meter (E2377A multimeter by HEWLETT PACKARD). Based on the measurement, and an electrode area and a thickness of the sintered body, an insulation resistance p was calculated. In the present example, 20 samples were subject to measurement to obtain the average, which was used for evaluation. As an evaluation criterion, those of $1.0\Delta10^8 \Omega \cdot m$ or more were evaluated as GOOD. The results shown in Table 1.

TABLE 1

| Sample No. | | $B_2O_3$-based glass (wt %) | CuO (wt %) | MnO (wt %) | Shrinkage Factor | Relative Density | Specific Permittivity $\epsilon_g$ | Q Value | Insulation Resistance $\rho$ ($\Omega \cdot m$) |
|---|---|---|---|---|---|---|---|---|---|
| | | Subcomponent | | | Properties of Sintered Body | | | | |
| Sample 1 | Comp. Example | 1.0 | 1.0 | 0.3 | 7.3% | 64.9% | 115 | 104 | 2.6E+07 |
| Sample 2 | Example | 2.0 | 1.0 | 0.3 | 18.6% | 97.9% | 265 | 1581 | 1.3E+12 |
| Sample 2a | Example | 2.0 | 0 | 0 | 17.6% | 90.5% | 204 | 298 | 8.4E+09 |
| Sample 3 | Example | 3.0 | 1.0 | 0.3 | 19.0% | 95.9% | 247 | 1337 | 1.6E+12 |
| Sample 4 | Example | 4.0 | 1.0 | 0.3 | 19.3% | 95.8% | 238 | 1419 | 2.2E+11 |
| Sample 5 | Example | 4.5 | 1.0 | 0.3 | 19.3% | 95.4% | 236 | 1503 | 2.6E+11 |
| Sample 6 | Example | 5.0 | 1.0 | 0.3 | 19.5% | 95.2% | 234 | 1456 | 2.7E+11 |
| Sample 7 | Example | 7.0 | 1.0 | 0.3 | 19.8% | 93.9% | 209 | 1212 | 2.2E+11 |
| Sample 7a | Example | 7.0 | 0 | 0 | 19.0% | 92.2% | 206 | 405 | 3.4E+10 |
| Sample 8 | Comp. Example | 8.0 | 1.0 | 0.3 | 20.0% | 92.8% | 198 | 564 | 6.3E+10 |
| Sample 9 | Comp. Example | 10.0 | 1.0 | 0.3 | 20.2% | 91.0% | 177 | 489 | 1.9E+10 |

In Table, "mE + n" means "m × 10$^{+n}$".

From Table 1, when $B_2O_3$—ZnO—$SiO_2$-based glass (glass softening point: 630° C.) is included as a glass component in a range of the present invention (Samples 2 to 7a), sinterability is sufficient, and the specific permittivity, loss Q value and insulation resistance are all good. In addition, since it has moderate shrinkage factor, for example, when applying it to a capacitor portion of LC complex electronic device, it is possible to adjust to the shrinkage factor of the coil portion.

On the other hand, when a content of the glass component is below the range of the present invention (Sample 1), there is no sintering, so that it can be confirmed that the properties are remarkably inferior. Also, when a content of the glass component exceeds the range of the present invention (Samples 8 and 9), it results in lowering the specific permittivity.

Example 2

Except for changing the contents of the glass component and CuO to those shown in Table 2, a dielectric ceramic composition was produced as with Sample 2, and same evaluation was performed as in Example 1. The results are shown in Table 2.

From Table 2, compared with Sample 11 and Sample 12, by including CuO, it can be confirmed to largely improve any of the specific permittivity, loss Q value and insulation resistance. Same tendency is found in Sample 13 and Sample 14. Also, when the content of CuO is out of the preferable range of the present invention (Sample 19), it can be confirmed that loss Q value and insulation resistance tend to deteriorate.

Example 3

Except for changing the content of MnO to those shown in Table 3, a dielectric ceramic composition was produced as with Sample 3, and same evaluation was performed as in Example 1. The results are shown in Table 3.

TABLE 2

| Sample No. | | $B_2O_3$-based glass (wt %) | CuO (wt %) | MnO (wt %) | Shrinkage Factor | Relative Density | Specific Permittivity $\epsilon_g$ | Q Value | Insulation Resistance $\rho$ ($\Omega \cdot m$) |
|---|---|---|---|---|---|---|---|---|---|
| | | Subcomponent | | | Properties of Sintered Body | | | | |
| Sample 10 | Comp. Example | 1.0 | 0 | 0.3 | 5.1% | 59.0% | 75 | 434 | 1.3E+07 |
| Sample 11 | Example | 2.0 | 0 | 0.3 | 17.3% | 90.4% | 208 | 501 | 2.3E+10 |
| Sample 12 | Example | 2.0 | 0.5 | 0.3 | 18.4% | 97.2% | 264 | 2039 | 1.5E+12 |
| Sample 13 | Example | 4.5 | 0 | 0.3 | 18.1% | 92.0% | 220 | 705 | 6.6E+10 |
| Sample 14 | Example | 4.5 | 0.5 | 0.3 | 19.0% | 95.1% | 233 | 2389 | 1.0E+12 |
| Sample 15 | Example | 4.5 | 2.0 | 0.3 | 19.2% | 96.8% | 235 | 1433 | 3.1E+11 |
| Sample 16 | Example | 4.5 | 5.0 | 0.3 | 18.9% | 97.4% | 231 | 553 | 9.3E+09 |
| Sample 17 | Example | 4.5 | 10.0 | 0.3 | 18.7% | 98.1% | 223 | 257 | 2.5E+08 |
| Sample 18 | Comp. Example | 4.5 | 12.0 | 0.3 | 18.7% | 98.3% | 220 | 130 | 4.5E+07 |

In Table, "mE + n" means "m × 10$^{+n}$".

TABLE 3

| Sample No. | | Subcomponent | | | Properties of Sintered Body | | | | |
|---|---|---|---|---|---|---|---|---|---|
| | | $B_2O_3$-based glass (wt %) | CuO (wt %) | MnO (wt %) | Shrinkage Factor | Relative Density | Specific Permittivity $\epsilon g$ | Q Value | Insulation Resistance $\rho$ ($\Omega \cdot m$) |
| Sample 19 | Example | 3.0 | 1.0 | 0 | 19.3% | 95.9% | 244 | 432 | 3.9E+11 |
| Sample 3 | Example | 3.0 | 1.0 | 0.3 | 19.0% | 95.9% | 247 | 1337 | 1.6E+12 |
| Sample 20 | Example | 3.0 | 1.0 | 0.7 | 18.9% | 94.9% | 230 | 1341 | 6.1E+10 |
| Sample 21 | Example | 3.0 | 1.0 | 1.5 | 18.3% | 92.6% | 206 | 347 | 3.4E+09 |
| Sample 22 | Comp. Example | 3.0 | 1.0 | 1.8 | 18.0% | 91.7% | 183 | 88 | 5.6E+08 |

In Table, "mE + n" means "m × 10$^{+n}$".

From Table 3, by comparison of Sample 3 with Sample 19, it can be confirmed that inclusion of MnO causes to improve loss Q value and insulation resistance. Also, when the content of MnO is out of the preferable range of the present invention (Sample 22), it can be confirmed that specific permittivity, loss Q value and insulation resistance tend to deteriorate.

Example 4

Except for changing the glass component to the other glass component shown in Table 4, a dielectric ceramic composition was produced as with Sample 3, and same evaluation was performed as in Example 1. The results are shown in Table 4.

Note that the composition of $B_2O_3$—$SiO_2$—BaO—CaO-based glass (Sample 23) was $B_2O_3$: 30 wt %, $SiO_2$: 20 wt %, BaO: 25 wt % and CaO: 25 wt %;

the composition of $B_2O_3$—ZnO—BaO-based glass (Sample 24) was $B_2O_3$: 30 wt %, ZnO: 30 wt % and BaO: 40 wt %;

the composition of $B_2O_3$—ZnO-based glass (Sample 25) was $B_2O_3$: 65 wt % and ZnO: 35 wt %;

the composition of $B_2O_3$—ZnO—$SiO_2$—BaO-based glass (Sample 26) was $B_2O_3$: 45 wt %, ZnO: 20 wt %, $SiO_2$: 5 wt % and BaO: 30 wt %.

Also, the glass softening point of the glass component of Samples 23 to 26 was 800° C. or lower, and the glass softening point of the glass component ($SiO_2$—$Al_2O_3$—BaO) of Sample 27 was higher than 800° C.

From Table 4, Samples 23 to 26, using the glass component including $B_2O_3$ with the glass softening point of 800° C. or lower, show good properties. On the other hand, Sample 27, using the glass component including no $B_2O_3$ with the glass softening point of higher than 800° C. was not sintered at 900° C.

Example 5

A dielectric ceramic composition was produced so that a content of $B_2O_3$—ZnO-based glass as the glass component was those shown in Table 5 (Samples 25 and 29) and contents in a form of oxide of $B_2O_3$ and ZnO constituting the glass component were those shown in Table 5 (Samples 28 and 30), and same evaluation was performed as in Example 1. The results are shown in Table 5.

TABLE 4

| Sample No. | | Glass Component | Subcomponent | | | Properties of Sintered Body | | | | |
|---|---|---|---|---|---|---|---|---|---|---|
| | | | Glass (wt %) | CuO (wt %) | MnO (wt %) | Shrinkage Factor | Relative Density | Specific Permittivity $\epsilon g$ | Q Value | Insulation Resistance $\rho$ ($\Omega \cdot m$) |
| Sample 3 | Example | $B_2O_3$—ZnO—$SiO_2$ | 3.0 | 1.0 | 0.3 | 19.0% | 95.9% | 247 | 1337 | 1.6E+12 |
| Sample 23 | Example | $B_2O_3$—$SiO_2$—BaO—CaO | 3.0 | 1.0 | 0.3 | 19.7% | 94.9% | 232 | 273 | 1.0E+11 |
| Sample 24 | Example | $B_2O_3$—ZnO—BaO | 3.0 | 1.0 | 0.3 | 19.5% | 94.2% | 222 | 579 | 5.0E+11 |
| Sample 25 | Example | $B_2O_3$—ZnO | 3.0 | 1.0 | 0.3 | 20.0% | 97.0% | 248 | 740 | 8.4E+11 |
| Sample 26 | Example | $B_2O_3$—ZnO—$SiO_2$—BaO | 3.0 | 1.0 | 0.3 | 19.6% | 96.4% | 237 | 1336 | 3.6E+11 |
| Sample 27 | Comp. Example | $SiO_2$—$Al_2O_3$—BaO | 3.0 | 1.0 | 0.3 | | | not sintered | | |

In Table, "mE + n" means "m × 10$^{+n}$".

TABLE 5

| Sample No. | | Subcomponent | | | | Properties of Sintered Body | | | | |
|---|---|---|---|---|---|---|---|---|---|---|
| | | $B_2O_3$-based glass (wt %) | $B_2O_3$ (wt %) | ZnO (wt %) | CuO (wt %) | MnO (wt %) | Shrinkage Factor | Relative Density | Specific Permittivity $\epsilon g$ | Q Value | Insulation Resistance $\rho$ ($\Omega \cdot m$) |
| Sample 25 | Example | 3.0 | — | — | 1.0 | 0.3 | 20.0% | 97.0% | 248 | 740 | 8.4E+11 |
| Sample 28 | Example | — | 1.0 | 2.0 | 1.0 | 0.3 | 20.1% | 97.2% | 248 | 763 | 1.6E+12 |
| Sample 29 | Example | 4.5 | — | — | 1.0 | 0.3 | 20.1% | 95.4% | 236 | 1201 | 2.6E+11 |
| Sample 30 | Example | — | 1.5 | 3.0 | 1.0 | 0.3 | 20.3% | 95.4% | 239 | 1114 | 6.5E+11 |

In Table, "mE + n" means "m × $10^{+n}$".

From Table 5, even when the glass component according to the present invention was included as a form of each oxide constituting the glass component in the dielectric ceramic composition, it can be confirmed that specific permittivity and loss Q value and insulation resistance are all good.

As described above, according to the present invention, it is possible to obtain a dielectric ceramic composition good in any of specific permittivity, loss Q value and insulation resistance. Also, even when firing at 900° C., it is possible to be sufficiently sintered, and to have an appropriate shrinkage factor.

Therefore, when a dielectric ceramic composition according to the present invention was applied to an LC complex electronic device, it is possible to co-fire with a magnetic layer constituting a coil portion, so that a complex electronic device having a dielectric layer with the above favorable properties can be provided.

Also, a dielectric ceramic composition of the present invention is favorably used as a dielectric layer of a multilayer ceramic capacitor wherein an internal electrode layer is composed of Ag.

The invention claimed is:

1. A dielectric ceramic composition comprising a main component consisting of strontium titanate, and as a subcomponent, a glass component including an oxide of B, wherein
    a content of said glass component is 2 to 7 wt % with respect to 100 wt % of said main component.

2. The dielectric ceramic composition as set forth in claim 1, wherein said glass component does not include an oxide of Bi.

3. The dielectric ceramic composition as set forth in claim 1, wherein said dielectric ceramic composition further comprises an oxide of Cu as a subcomponent; and
    a content of said oxide of Cu, calculated as a conversion of CuO, is more than 0 wt %, and 10 wt % or less with respect to 100 wt % of said main component.

4. The dielectric ceramic composition as set forth in claim 2, wherein said dielectric ceramic composition further comprises an oxide of Cu as a subcomponent; and
    a content of said oxide of Cu, calculated as a conversion of CuO, is more than 0 wt %, and 10 wt % or less with respect to 100 wt % of said main component.

5. The dielectric ceramic composition as set forth in claim 1, wherein said dielectric ceramic composition further comprises an oxide of Mn as a subcomponent; and
    a content of said oxide of Mn, calculated as a conversion of MnO, is more than 0 wt %, and 1.5 wt % or less with respect to 100 wt % of said main component.

6. The dielectric ceramic composition as set forth in claim 2, wherein said dielectric ceramic composition further comprises an oxide of Mn as a subcomponent; and
    a content of said oxide of Mn, calculated as a conversion of MnO, is more than 0 wt %, and 1.5 wt % or less with respect to 100 wt % of said main component.

7. The dielectric ceramic composition as set forth in claim 3, wherein said dielectric ceramic composition further comprises an oxide of Mn as a subcomponent; and
    a content of said oxide of Mn, calculated as a conversion of MnO, is more than 0 wt %, and 1.5 wt % or less with respect to 100 wt % of said main component.

8. The dielectric ceramic composition as set forth in claim 4, wherein said dielectric ceramic composition further comprises an oxide of Mn as a subcomponent; and
    a content of said oxide of Mn, calculated as a conversion of MnO, is more than 0 wt %, and 1.5 wt % or less with respect to 100 wt % of said main component.

9. A dielectric ceramic composition comprising a main component consisting of strontium titanate, and as a subcomponent, an oxide component including an oxide of B, wherein
    a content of said oxide component is 2 to 7 wt % with respect to 100 wt % of said main component.

10. The dielectric ceramic composition as set forth in claim 9, wherein said oxide component does not include an oxide of Bi.

11. The dielectric ceramic composition as set forth in claim 9, wherein said dielectric ceramic composition further comprises an oxide of Cu as a subcomponent; and
    a content of said oxide of Cu, calculated as a conversion of CuO, is more than 0 wt %, and 10 wt % or less with respect to 100 wt % of said main component.

12. The dielectric ceramic composition as set forth in claim 10, wherein said dielectric ceramic composition further comprises an oxide of Cu as a subcomponent; and
    a content of said oxide of Cu, calculated as a conversion of CuO, is more than 0 wt %, and 10 wt % or less with respect to 100 wt % of said main component.

13. The dielectric ceramic composition as set forth in claim 9, wherein said dielectric ceramic composition further comprises an oxide of Mn as a subcomponent; and
    a content of said oxide of Mn, calculated as a conversion of MnO, is more than 0 wt %, and 1.5 wt % or less with respect to 100 wt % of said main component.

14. The dielectric ceramic composition as set forth in claim 10, wherein said dielectric ceramic composition further comprises an oxide of Mn as a subcomponent; and
    a content of said oxide of Mn, calculated as a conversion of MnO, is more than 0 wt %, and 1.5 wt % or less with respect to 100 wt % of said main component.

15. The dielectric ceramic composition as set forth in claim 11, wherein said dielectric ceramic composition further comprises an oxide of Mn as a subcomponent; and
    a content of said oxide of Mn, calculated as a conversion of MnO, is more than 0 wt %, and 1.5 wt % or less with respect to 100 wt % of said main component.

16. The dielectric ceramic composition as set forth in claim 12, wherein said dielectric ceramic composition further comprises an oxide of Mn as a subcomponent; and a content of said oxide of Mn, calculated as a conversion of MnO, is more than 0 wt %, and 1.5 wt % or less with respect to 100 wt % of said main component.

17. A complex electronic device comprising:

a coil portion constituted by a coiled conductor and a magnetic layer, and a capacitor portion constituted by an internal electrode layer and a dielectric layer, wherein said internal electrode layer includes Ag as a conducting material; and said dielectric layer is constituted by the dielectric ceramic composition as set forth in claim 1.

18. A multilayer ceramic capacitor comprising an element body in which an internal electrode layer and a dielectric layer are alternately stacked, wherein said internal electrode layer includes Ag as a conducting material; and said dielectric layer is constituted by the dielectric ceramic composition as set forth in claim 1.

* * * * *